(12) United States Patent
Seino et al.

(10) Patent No.: US 8,703,407 B2
(45) Date of Patent: Apr. 22, 2014

(54) PATTERN FORMATION METHOD

(75) Inventors: Yuriko Seino, Yokohama (JP); Yukiko Kikuchi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 146 days.

(21) Appl. No.: 13/188,027

(22) Filed: Jul. 21, 2011

(65) Prior Publication Data

US 2012/0058435 A1 Mar. 8, 2012

(30) Foreign Application Priority Data

Sep. 7, 2010 (JP) ................................ 2010-199642

(51) Int. Cl.
*G03F 7/20* (2006.01)
(52) U.S. Cl.
USPC .......................................... 430/324; 430/325
(58) Field of Classification Search
USPC .................... 430/394, 324, 314, 328
See application file for complete search history.

(56) References Cited

U.S. PATENT DOCUMENTS

| | | | |
|---|---|---|---|
| 2002/0055239 A1* | 5/2002 | Tuominen et al. | 438/466 |
| 2003/0091752 A1* | 5/2003 | Nealey et al. | 427/558 |
| 2006/0132748 A1* | 6/2006 | Fukuhara | 355/67 |
| 2007/0134420 A1* | 6/2007 | Koberstein et al. | 427/258 |
| 2009/0269705 A1* | 10/2009 | Kobrin | 430/322 |
| 2011/0186544 A1 | 8/2011 | Endou et al. | |

FOREIGN PATENT DOCUMENTS

| | | |
|---|---|---|
| JP | 8-101494 | 4/1996 |
| JP | 2008-149447 | 7/2008 |
| JP | 2010-152013 | 7/2010 |

OTHER PUBLICATIONS

English Machine Translation, Shimizu, JP 08-101494, Apr. 16, 1996.*
Cheng et al.; "Dense Self-Assembly on Sparse Chemical Patterns: Rectifying and Multiplying Lithographic Patterns Using Block Copolymers", Advanced Materials, vol. 20, pp. 3155-3158, (2008).
Ruiz et al.; "Density Multiplication and Improved Lithography by Directed Block Copolymer Assembly", Science, vol. 321, pp. 936-939, (2008).
Notification of Reason for Rejection issued by the Japanese Patent Office on Feb. 5, 2013, for Japanese Patent Application No. 2010-199642, and English-language translation thereof.

* cited by examiner

*Primary Examiner* — Cynthia Kelly
*Assistant Examiner* — Caleen Sullivan
(74) *Attorney, Agent, or Firm* — Finnegan, Henderson, Farabow, Garrett & Dunner, L.L.P.

(57) ABSTRACT

According to one embodiment, a pattern formation method contains: forming first guides by changing a surface energy of an underlayer material by transferring a pattern of a photomask onto the underlayer material by exposure, and forming second guides by changing the surface energy of the underlayer material between the first guides by diffraction of exposure light generated from the exposure; applying a block copolymer containing a plurality of types of polymer block chains onto the underlayer material; and causing any one of the polymer block chains to form a pattern in accordance with the first and second guides by microphase separation of the block copolymer by a heat treatment.

18 Claims, 5 Drawing Sheets

PATTERN FORMATION METHOD

CROSS REFERENCE TO RELATED APPLICATIONS

This application is based upon and claims the benefit of priority from prior Japanese Patent Application No. 2010-199642, filed on Sep. 7, 2010, the entire contents of which are incorporated by reference herein.

FIELD

Embodiments of the present invention relate to a pattern formation method.

BACKGROUND

As one of conventional technologies, a pattern formation method for forming a regular pattern on a material to be processed by utilizing self-assembly of a block copolymer containing a plurality of types of polymer block chains has been known. In the pattern formation method, chemical guides having high affinity with a specific polymer block chain are formed on the material to be processed, and the regular pattern is formed by segregation of the specific polymer block chain in accordance with the chemical guides through the self-assembly by heating.

DETAILED DESCRIPTION

According to one embodiment, a pattern formation method contains: forming first guides by changing a surface energy of an underlayer material by transferring a pattern of a photomask onto the underlayer material by exposure and forming second guides by changing the surface energy of the underlayer material between the first guides by diffraction of exposure light generated from the exposure; applying a block copolymer containing a plurality of types of polymer block chains onto the underlayer material; and causing any one of the polymer block chains to form a pattern in accordance with the first and second guides by microphase separation of the block copolymer by a heat treatment.

(First Embodiment)

In the first embodiment, a method of forming a regular pattern by forming polymer block chains on chemical guides including a pattern by a sidelobe will be described.

Figure 1A:
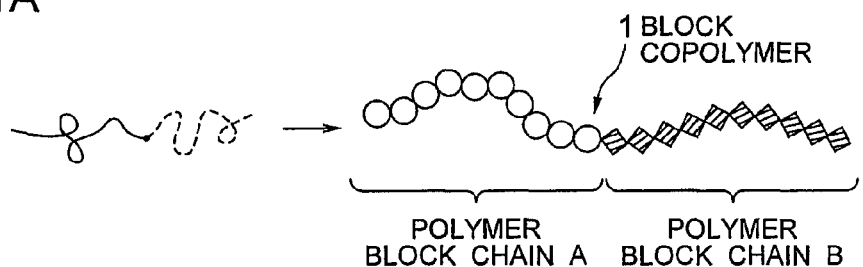
FIG. 1A is a diagram schematically showing a block copolymer according to a first embodiment.
Figure 1B:
FIG. 1B is a diagram schematically showing a state before self-assembly of the block copolymer according to the first embodiment.
Figure 1C:
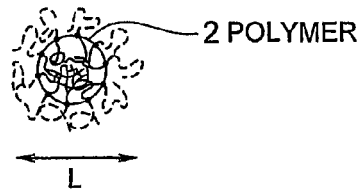
FIG. 1C is a diagram schematically showing a state after the self-assembly of the block copolymer according to the first embodiment.
Figure 1D:
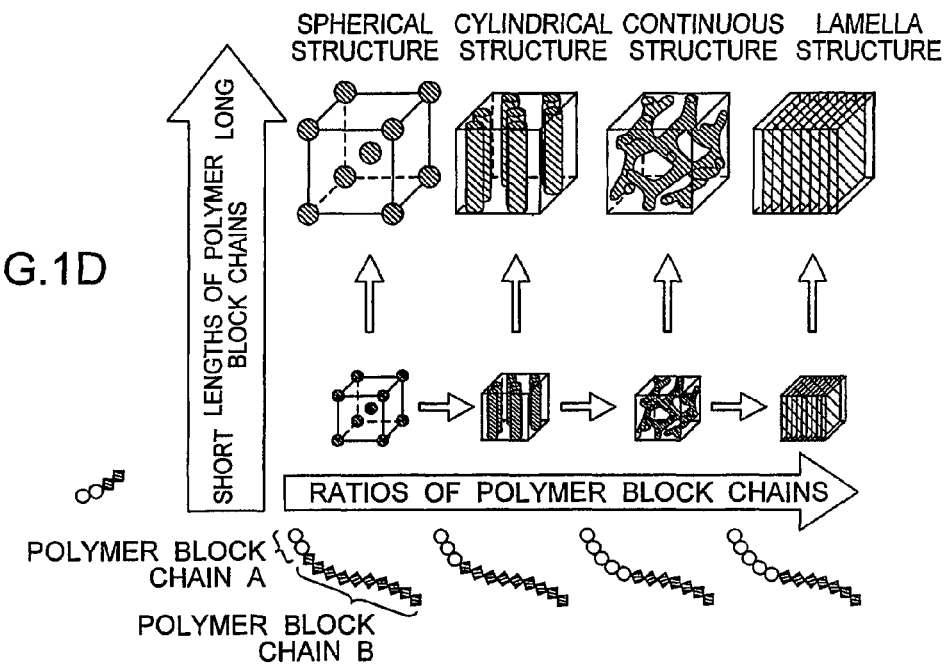
FIG. 1D is a diagram schematically showing a structure formed by microphase separation according to the first embodiment, lengths of polymer block chains, and a relationship between ratios of lengths of the two polymer block chains.

FIG. 1A is a diagram schematically showing a block copolymer according to a first embodiment. FIG. 1B is a diagram schematically showing a state before self-assembly of the block copolymer according to the first embodiment. FIG. 1C is a diagram schematically showing a state after the self-assembly of the block copolymer according to the first embodiment. FIG. 1D is a diagram schematically showing a structure formed by microphase separation according to the first embodiment, lengths of polymer block chains, and a relationship between ratios of the lengths of the two polymer block chains.

A block copolymer 1 is formed by linear chemical bonding of two different polymer block chains A and B as shown in FIG. 1A. The two different polymer block chains A and B may preferably be polystyrene and polymethyl methacrylate, polystyrene and polyferrocenyl dimethylsilene, polystyrene and polybutadiene, polystyrene and polyisoprene, and the like, for example, in view of the easy microphase separation.

In the present embodiment, PS (polystyrene) is used as the polymer block chain A, and PMMA (polymethyl methacrylate) is used as the polymer block chain B. The block copolymer 1 may be those obtainable by bonding three or more types of polymer block chains. Also, the block copolymer 1 may be a star type in which one or more types of polymer block chains radially extend from the center or may be those in which one polymer block chain is suspended from a main chain of the other polymer block chain.

These two polymer block chains A and B have properties of repelling each other as in water and oil and tend to separate from each other. However, since the two polymer block chains A and B are bonded in the block copolymer 1, they cannot be separated from each other. Accordingly, for example, when a heat treatment is performed, the block copolymer 1 undergoes microphase separation from a disassembled state as shown in FIG. 1B to a self-assembled state as shown in FIG. 1C, for example. As a result of the microphase separation, the block copolymer 1 forms a nanostructure having the size of L (e.g. several nanometers to several hundreds of nanometers) which is similar to the polymer block chains, as shown in FIG. 1C.

The size of the structure generated by the microphase separation depends on lengths (molecular weights) of the polymer block chains. As shown in FIG. 1D, the structure is small when the polymer block chains are short while large when the polymer block chains are long. The block copolymer 1 undergoes the microphase separation to be formed into a spherical structure, a cylindrical structure, a continuous structure, or a lamella structure depending on ratios (composition ratios) of the polymer block chains A and B.

The spherical structure is a structure formed when the polymer block chains having the smaller composition ratio aggregate in the form of a sphere in the block copolymer 1.

The cylindrical structure is a structure formed when the polymer block chains having the smaller composition ratio aggregate in the form of a column in the block copolymer 1.

The continuous structure is a structure formed when the polymer block chains having the smaller composition ratio aggregate in the form of a three-dimensional lattice in the block copolymer 1.

The lamella structure is a structure produced when the composition ratios are equal to each other, for example, and as a result of alternating laminations of the two phases in the form of flat surfaces.

It is preferable that the polymer block chains forming the block copolymer 1 have a difference in etching rates. Due to the etching rate difference, it is possible to eliminate one of the polymer block chains.

That is, coating ratios when the polymer block chain of the smaller composition ratio is removed are in the order of lamella structure<continuous structure<cylindrical structure<spherical structure. The coating ratio of the lamella structure is 50%. In turn, coating ratios when the polymer block chain of the larger composition ratio is removed are, for example, in the order of spherical structure<cylindrical structure<continuous structure<lamella structure.

In the case of creating the lamella structure, a film formed of the block copolymer 1 may preferably have a film thickness which is about 1.5 times of a pitch of PS and PMMA, for example. In the case of creating the spherical structure or the cylindrical structure, a film formed from the block copolymer 1 may preferably have a film thickness which is about equal to a pitch of PS and PMMA, for example. Hereinafter, a semiconductor device production method according to the first embodiment will be described.

FIGS. 2A to 2D are sectional views each showing a main part in a semiconductor device production method according to the first embodiment. Hereinafter, formation of a line-and-space patter using the sidelobe will be described.

To start with, a silane coupling agent is applied on a surface of a material to be processed 10 by spin coating, and a SAM (self-assembled monolayer) film 12 is formed on the material to be processed 10.

The material to be processed 10 may be a Si substrate or an oxide film, for example.

The silane coupling agent may be those having affinity with both of PS and PMMA, for example. As the silane coupling agent, a material containing as a main component organosilane such as p-chloromethylphenyltrimethoxysilane and chloromethylphenylethyltrimethoxysilane may be used. Also, as a method of forming the SAM film 12, a method of depositing the silane coupling agent to the material to be processed 10 by vapor deposition may be employed.

The SAM film 12 is a monomolecular film which is chemically bonded to the surface of the material to be processed 10 and has a spontaneous high orientation property due to attractive interaction between molecules (e.g. van der Waals' attraction between alkyl chains).

Figure 2A:
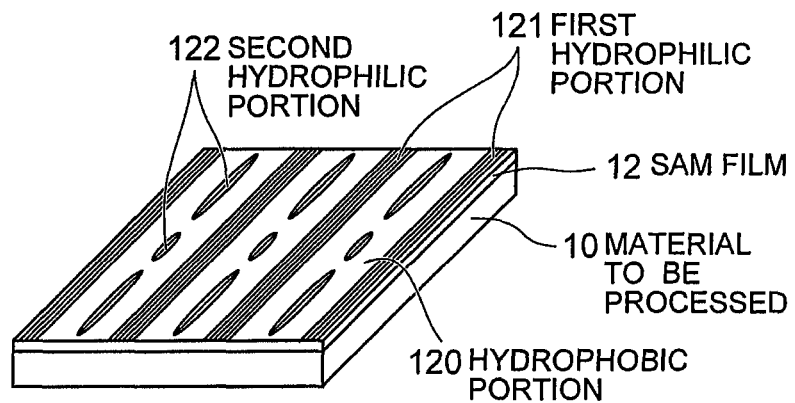
FIGS. 2A to 2D are sectional views each showing a main part in a semiconductor device production method according to the first embodiment.

Next, the SAM film 12 is subjected to exposure as shown in FIG. 2A to form a hydrophobic portion 120, a first hydrophilic portion 121 used as a first guide, and a second hydrophilic portion 122 used as a second guide on the SAM film 12.

More specifically, a line pattern formed on a photomask by photolithography using an ArF excimer laser as exposure light is transferred onto the SAM film 12. In the portion which is irradiated with the exposure light, a surface energy of the SAM film 12 is changed from hydrophobic to hydrophilic to be the first hydrophilic portion 121 indicated by shading in FIG. 2A. Since a line width and a space width are identical to each other, the first hydrophilic portion 121 is formed with the interval of three times of the width, for example.

Also, along with the exposure, a pattern by the sidelobe is formed in the vicinity of the center between the adjacent lines to be the second hydrophilic portion 122. The second hydrophilic portion 122 is not limited to the case wherein the hydrophilic portions are varied in shape and the like as shown in FIG. 2A and may have an identical shape. Also, the second hydrophilic portion 122 functions as the chemical guide due to a self-repairing function of the polymer 2 in the case where a width thereof is narrower than the width of the line pattern. The first and second hydrophilic portions 121, 122 become the chemical guides.

The sidelobe is generated by diffraction of the exposure light which passed through a phase shift mask and forms a spot having high optical intensity at a position different from an opening pattern of the mask. In the semiconductor device production, it is normally important to suppress the sidelobe, but, since the pattern by the sidelobe is used as the chemical guides in the present embodiment, the sidelobe is intentionally formed. As the phase shift mask, for example, a halftone mask having an exposure light transmittance of about 6% to 20% may be used.

Figure 2B:
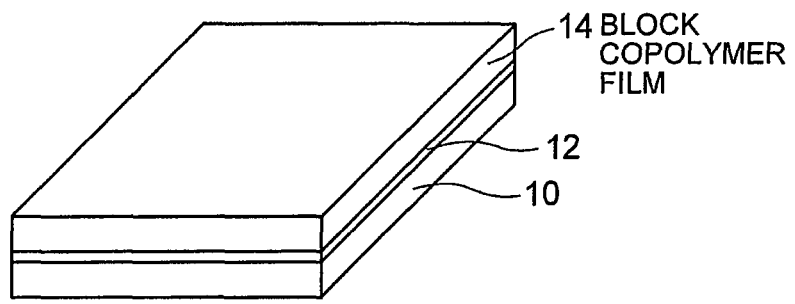

Next, a solution containing the block copolymer 1 is applied on the SAM film 12 by spin coating as shown in FIG. 2B to form a block copolymer film 14.

The solution is obtainable by dissolving 3 wt % of the block copolymer 1 formed of PS (Mw: 40000) and PMMA (Mw: 40000) into toluene.

In the solution, a composition ratio between PS and PMMA is 50:50 in order to form the lamella structure shown in FIG. 1D. In the block copolymer 1, molecular weights of the polymer block chains A and B may preferably be equal to each other. A film thickness of the block copolymer film 14 is 40 nm, for example.

Figure 2C:
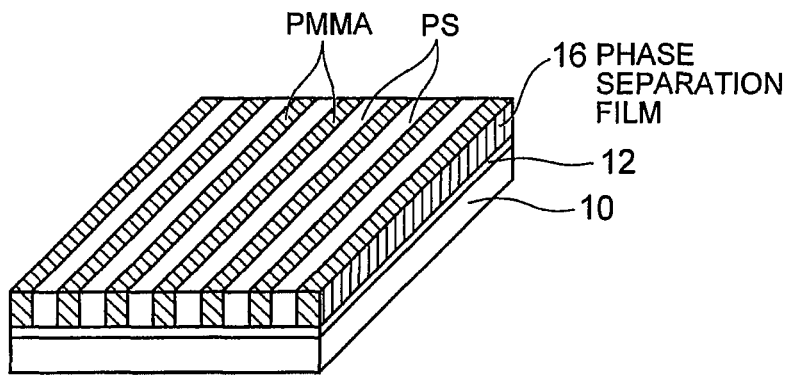

Next, as shown in FIG. 2C, a phase separation film 16 is formed by microphase separation of the block copolymer film 14 by a heat treatment. The heat treatment is performed under a nitrogen atmosphere at 220° C. for several minutes.

As a result of the heat treatment, the phase separation film 16 is formed by the microphase separation which causes the block copolymer film 14 to follow the first and second hydrophilic portions 121, 122 which are the chemical guides. Since the block copolymer 1 forms the lamella structure by the microphase separation, PS and PMMA are aligned in the form of lines having an identical width along the first and second hydrophilic portions 121, 122, as shown in FIG. 2C. The second hydrophilic portion 122 is not in the form of a line, but a polymer 2 has a property of forming a line due to the self-repairing function even in the case where the chemical guide is not in the form of a line but formed as dotted or dashed lines. The second hydrophilic portion 122 formed depending on the sidelobe is varied, i.e. the second hydrophilic portion 122 may be narrower than the width of the first hydrophilic portion 121 or may have varied shapes depending on positions. However, the second hydrophilic portion 122 can be used as the chemical guide by utilizing the self-repairing function.

Figure 2D:
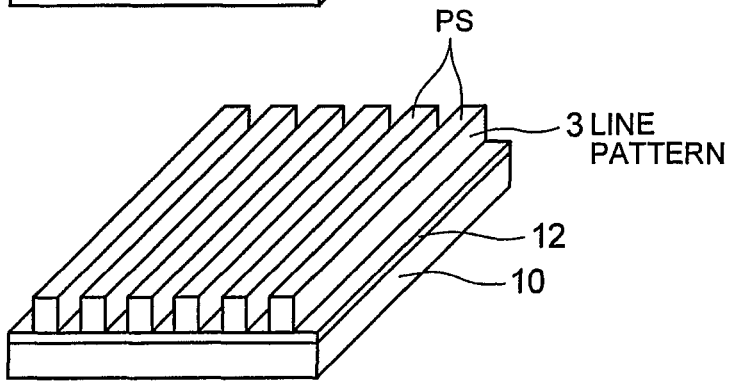

Next, PMMA of the phase separation film 16 is removed by dry etching as shown in FIG. 2D to form a line pattern 3 on the phase separation film 16. As the dry etching, dry etching using an oxygen gas may be performed, for example. In the dry etching, PMMA having the larger etching rate for the oxygen gas is removed, so that the line pattern 3 is formed on the phase separation film 16.

Next, the SAM film 12 and the material to be processed 10 are processed by using the phase separation film 16 on which the line pattern 3 is formed as a mask, followed by known steps, thereby obtaining a desired semiconductor device.

According to the first embodiment described above, it is possible to easily obtain the regular line pattern 3 by using the pattern by the sidelobe as the chemical guides.

(Second Embodiment)

The second embodiment is different from the first embodiment by the feature of forming a hole pattern. In each of the embodiments described below, when the structures and functions are the same as those of the first example, they are denoted by reference numerals same as those of the first example, and descriptions for them are not repeated.

FIGS. 3A to 3D are sectional views each showing a main part in a semiconductor device production method according to the second embodiment. In the case of forming a hole pattern as a pattern which can be formed by self-assembly of a polymer, arrangement in a triangular grid of hexagonal close-packed structure is stable. It is considered that it is possible to arrange a polymer 2a in a rectangular grid when chemical guides 121a are formed in a rectangular grid as shown in FIG. 4B. However, since the rectangular grid is forcedly attained by the chemical guides 121a, it is difficult to form a more microscopic pattern by space interpolation by self-assembly of the polymer 2a. FIG. 4C is a top view showing the SAM film after the exposure according to the first embodiment. In this embodiment, the second hydrophilic portion 122 is further formed inside a grid square of the first hydrophilic portions 121 used as the chemical guides on a rectangular grid as shown in FIG. 4C. The solid line shown in FIGS. 4A to 4C is added only for explanation. Hereinafter, a semiconductor production method according to the second embodiment will be described.

To start with, a silane coupling agent is applied on a surface of a material to be processed 10 by spin coating, and a SAM film 12 is formed on the material to be processed 10.

Figure 3A:
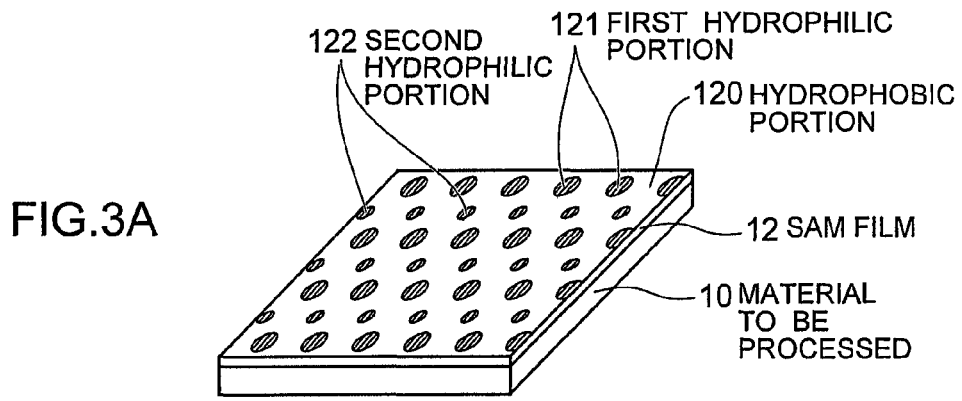
FIGS. 3A to 3D are sectional views each showing a main part in a semiconductor device production method according to a second embodiment.
Figure 4A:
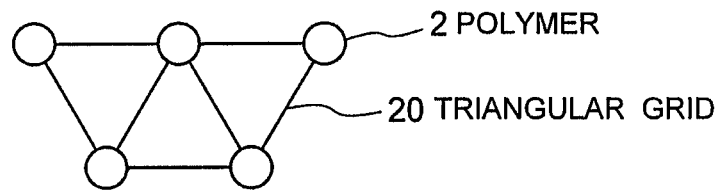
FIG. 4A is a diagram schematically showing a structure of the self-assembling polymer according to the first embodiment.
Figure 4B:
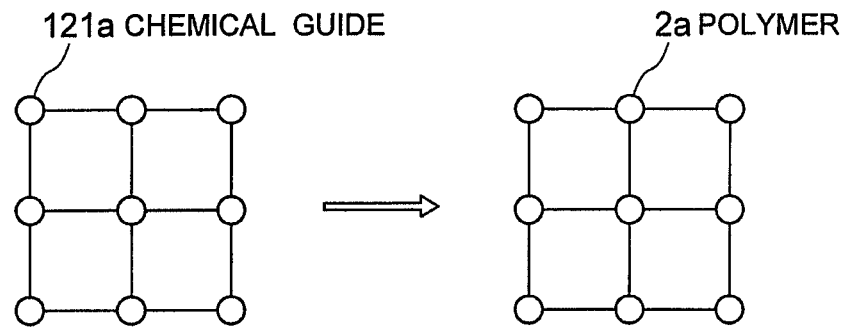
FIG. 4B is a diagram in which chemical guides arranged in a gird pattern are shown on the left, and a polymer aligned in accordance with the chemical guides is shown on the right.
Figure 4C:
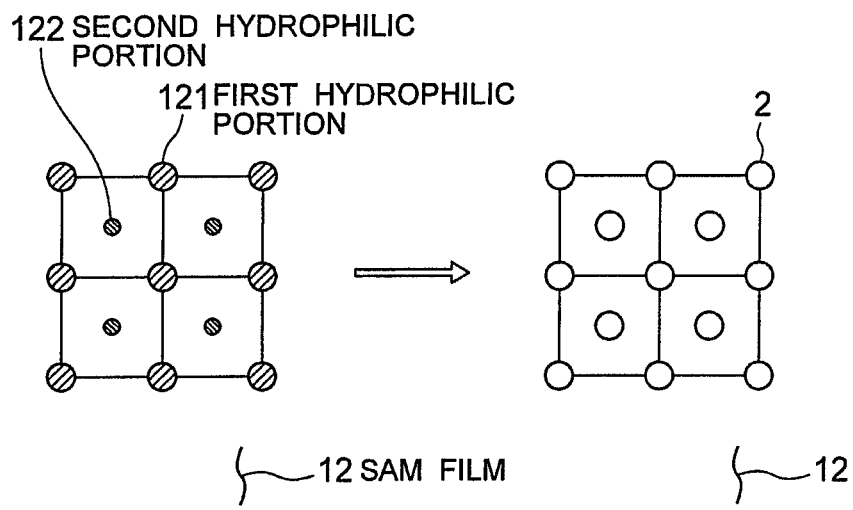
FIG. 4C is a diagram in which a top surface of a SAM film after exposure according to the first embodiment is shown on the left, and the polymer aligned in accordance with the chemical guides according to the first embodiment is shown on the right.

Next, the SAM film 12 is subjected to exposure as shown in FIG. 3A to form a hydrophobic portion 120 and first and second hydrophilic portions 121, 122. In the present embodiment, apertures corresponding to a pattern of the first hydrophilic portions 121 are formed on the mask pattern used in the exposure on the SAM film 12, and the second hydrophilic portions 122 are formed by a sidelobe in the exposure. It is possible to form the second hydrophilic portions 122 having a microscopic (smaller than the exposure limit) pattern which cannot be formed by the exposure by using the second hydrophilic portions 122 obtained by the sidelobe.

Figure 3B:
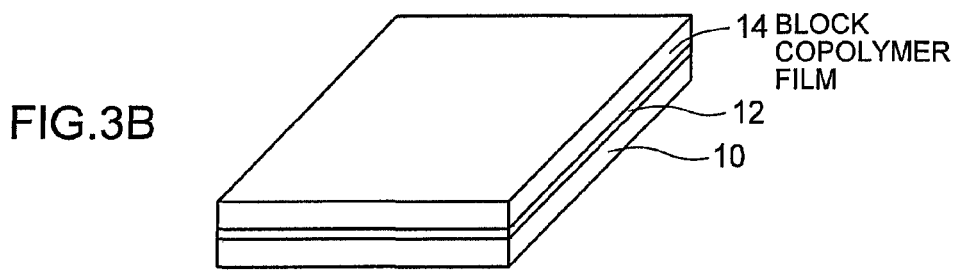

Next, a solution containing the block copolymer 1 is applied on the SAM film 12 by spin coating as shown in FIG. 3B to form a block copolymer film 14. The solution is obtainable, for example, by dissolving 3 wt % of the block copolymer 1 formed of PS (Mw: 100000) and PMMA (Mw: 40000) into toluene. In the solution, a composition ratio between PS and PMMA is 20:80 in order to form the spherical structure shown in FIG. 1D.

Figure 3C:
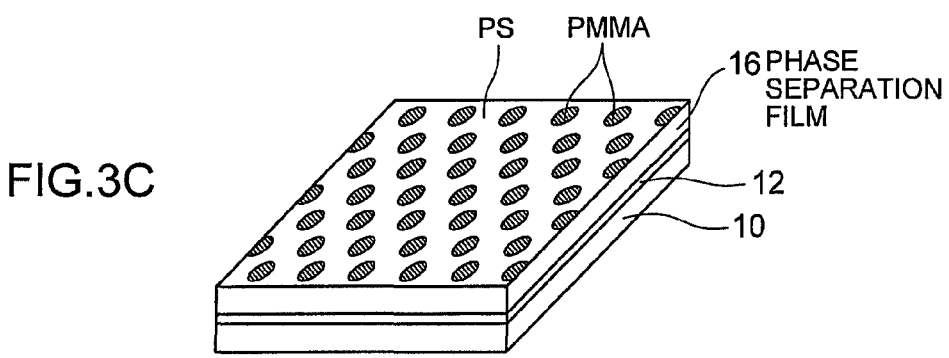

Next, as shown in FIG. 3C, a phase separation film 16 is formed by microphase separation of the block copolymer film 14 by heat treatment. The heat treatment is performed under a nitrogen atmosphere at 220° C. for several minutes. The heat treatment causes the microphase separation of the block copolymer film 14. In the case where any chemical guide is not formed on the SAM film which is the underlayer, PMMA which is the polymer block chain having the smaller composition ratio in the block copolymer 1 aggregates in the form of a sphere by the self-assembly as shown in FIG. 4A, and PS and PMMA forming the block copolymer 1 form a triangular grid 20 having a stable close-packed structure as a result of formation of a polymer 2.

However, since the first hydrophilic portions 121 are formed as the chemical guides in the form of a rectangular grid in the present embodiment, the polymer 2 is arranged in the rectangular grid. In addition, since the second hydrophilic portion 122 is preliminarily formed at a position in the grid square of the first hydrophilic portions 121 as the chemical guides where the space interpolation is to be performed, the space interpolation which has been difficult in a state where the second hydrophilic portion 122 is not formed is readily caused. Therefore, when the microphase separation of the block copolymer film 14 occurs, PMMA is disposed not only on the first hydrophilic portions 121 but also on the second hydrophilic portion 122 by the space interpolation.

Since the second hydrophilic portion 122 is formed by using the sidelobe, the second hydrophilic portion 122 is smaller than the first hydrophilic portion 121 as shown in FIG. 4C. However, it is possible to use the second hydrophilic portion 122 as the chemical guide by the utilization of the self-repairing function of the block copolymer 14. In short, it is possible to regularly arrange the polymer 2 having the uniform size as shown in FIG. 3C and FIG. 4C.

Figure 3D:
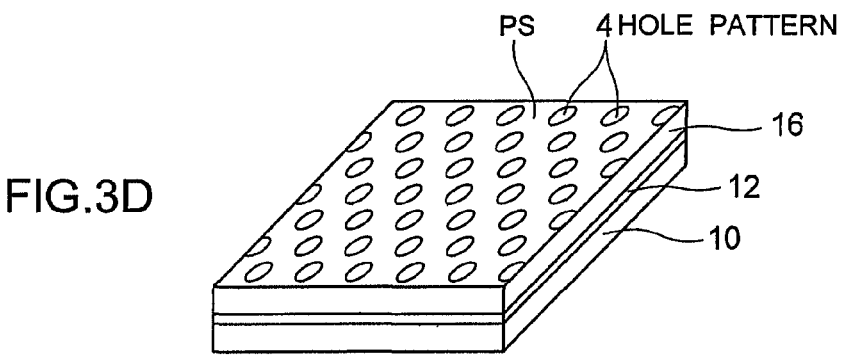

Next, PMMA of the phase separation film 16 is removed by dry etching, as shown in FIG. 3D, to form a hole pattern 4 on the phase separation film 16.

Next, the SAM film 12 and the material to be processed 10 are processed by using the phase separation film 16 on which the hole pattern 4 is formed as a mask, followed by known steps, thereby obtaining a desired semiconductor device.

(Effect of Second Embodiment)

According to the second embodiment, since the pattern by the sidelobe is used for the chemical guides, it is possible to stably arrange the polymer in the microscopic pattern which cannot formed by exposure, thereby making it possible to form the hole pattern 4.

(Third Embodiment)

The third embodiment is different from the foregoing embodiments by the feature of using a phase shift mask as a photomask. In the third embodiment, a chemical guide is formed by shifting a phase of exposure light by the phase shift mask.

Figure 5A:
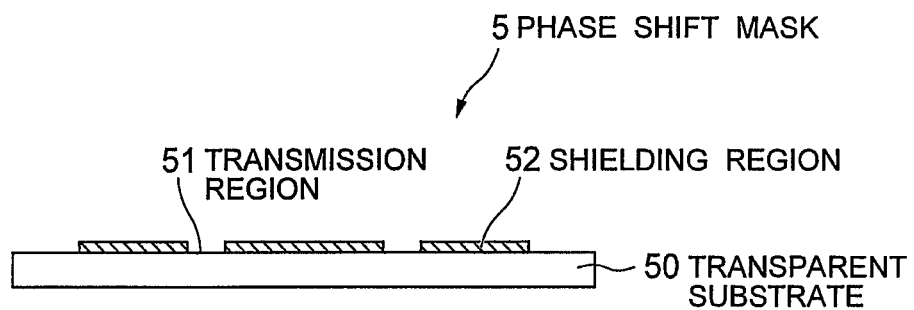
FIG. 5A is a sectional view showing a main part of a phase shift mask according to a third embodiment.
Figure 5B:
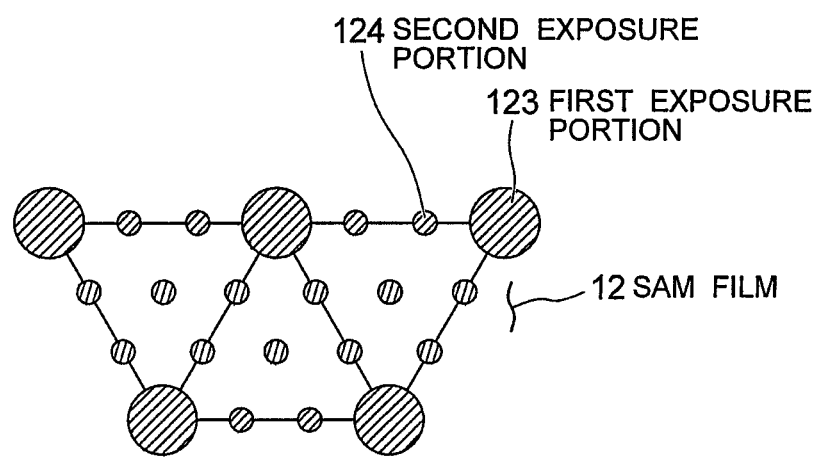
FIG. 5B is a top view showing a SAM film after exposure.

FIG. 5A is a sectional view showing a main part of phase shift mask according to a third embodiment. FIG. 5B is a top view showing a SAM film after the exposure according to a third embodiment. Shown in FIG. 5B is a position relationship between a first exposure portion 123 obtained by transfer of a pattern of a phase shift mask 5 and a second exposure portion 124 formed by shifting a phase of the exposure light.

As shown in FIG. 5A, for example, the phase shift mask 5 has a transmission region 51 which allows transmission of the exposure light and a shielding region 52 which shields the exposure light, and the transmission region 51 and the shielding region 52 are formed on a transparent substrate 50. As a method of shifting the phase of the exposure light, a method of shifting the phase by digging the transparent substrate 50 at a region adjacent to the transmission region 51, a method of shifting the phase by allowing the exposure light to pass through the shielding region 52 to a degree which does not expose the resist material to the light, and the like have been known in the art.

By employing the method of shifting the phase, it is possible to form the plurality of second exposure portions 124 between the first exposure portions 123 as shown in FIG. 5B.

As another method, a method of disposing a shifter, for example, which shifts the phase of the exposure light in the vicinity of a wafer, not in the vicinity of the mask, may be considered. It is possible to form the shifter by, for example, performing adjustment in the same manner as in the above-described method of forming the second exposure portion 124 by the phase shift.

In the semiconductor device production method using the phase shift mask 5 or the shifter, the subsequent steps are performed in the same manner as in the foregoing embodiments after the formation of the chemical guides including the first and second exposure portions 123, 124 by performing the exposure by using the phase shift mask 5 or the shifter.

According to the third embodiment described above, since it is possible to form the chemical guides having the narrower interval as compared to the method of forming the chemical guides according to the first and second embodiments, it is possible to form a more stable pattern by utilizing the self-repairing function of the block copolymer.

According to the first to third embodiments described above, it is possible to form the regular microscopic pattern in a short time by the use of chemical guides using the pattern formed by the sidelobe.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A pattern formation method comprising:
    forming first guides by changing a surface energy of an underlayer material by transferring a pattern of a photomask onto the underlayer material by exposure, and forming second guides by changing the surface energy of the underlayer material between the first guides by using a sidelobe formed by diffraction of exposure light generated from the exposure;
    applying a block copolymer containing a plurality of types of polymer block chains onto the underlayer material; and
    causing any one of the polymer block chains to form a pattern in accordance with the first and second guides by microphase separation of the block copolymer by a heat treatment,
    wherein the photomask has a line pattern, the first guides have a same line pattern as the photomask, and the second guides have a dotted or dashed line pattern.

2. The pattern formation method according to claim 1, wherein the underlayer material contains organosilane.

3. The pattern formation method according to claim 1, wherein the first and second guides have a hydrophilic property.

4. The pattern formation method according to claim 1, wherein the block copolymer is capable of microphase separation.

5. The pattern formation method according to claim 1, wherein the block copolymer contains any one of combinations of polystyrene and polymethyl methacrylate, polystyrene and polyferrocenyldimethylsilene, polystyrene and polybutadiene, and polystyrene and polyisoprene.

6. The pattern formation method according to claim 1, wherein
    the block copolymer contains a first polymer block chain and a second polymer block chain; and
    the first polymer block chain and the second polymer block chain are linearly chemically bonded.

7. The pattern formation method according to claim 6, wherein an etching rate of the first polymer block chain and an etching rate of the second polymer block chain are different from each other.

8. The pattern formation method according to claim 1, wherein the photomask has a hole pattern.

9. The pattern formation method according to claim 8, wherein the first guides have a rectangular grid pattern, and the second guide is formed inside the rectangular grid.

10. The pattern formation method according to claim 1, wherein a halftone mask having an exposure light transmittance of 6% to 20% is used as the photomask.

11. A pattern formation method comprising:
    forming first guides by changing a surface energy of an underlayer material by transferring a pattern of a phase shift mask onto the underlayer material by exposure, and forming second guides by changing the surface energy of the underlayer material between the first guides by using a sidelobe formed by a phase shift of exposure light;
    applying a block copolymer containing a plurality of types of polymer block chains onto the underlayer material; and
    causing any one of the polymer block chains to form a pattern in accordance with the first and second guides by microphase separation of the block copolymer by a heat treatment,
    wherein the phase shift mask has a line pattern, the first guides have a same line pattern as the phase shift mask, and the second guides have a dotted or dashed line pattern.

12. The pattern formation method according to claim 11, wherein the underlayer material contains organosilane.

13. The pattern formation method according to claim 11, wherein the phase shift mask contains a transparent substrate, a light transmission region, and a light shielding region, the light transmission region and the light shielding region being formed on the transparent substrate.

14. The pattern formation method according to claim 11, wherein the first and second guides have a hydrophilic property.

15. The pattern formation method according to claim 11, wherein the block copolymer is capable of microphase separation.

16. The pattern formation method according to claim 11, wherein the block copolymer contains any one of combinations of polystyrene and polymethyl methacrylate, polystyrene and polyferrocenyldimethylsilene, polystyrene and polybutadiene, and polystyrene and polyisoprene.

17. The pattern formation method according to claim 11, wherein
    the block copolymer contains a first polymer block chain and a second polymer block chain; and
    the first polymer block chain and the second polymer block chain are linearly chemically bonded.

18. The pattern formation method according to claim 17, wherein an etching rate of the first polymer block chain and an etching rate of the second polymer block chain are different from each other.

* * * * *